United States Patent [19]

Lubranski et al.

[11] Patent Number: 4,841,630

[45] Date of Patent: Jun. 27, 1989

[54] FABRICATION OF LEADED PACKAGES

[76] Inventors: Leon Lubranski, 10 Christopher Ct., Lodi, N.J. 07644; Theodore J. Sattler, P.O. Box 366, RD#4, Easton, Pa. 18042

[21] Appl. No.: 167,070

[22] Filed: Mar. 11, 1988

[51] Int. Cl.⁴ .................. H05K 13/00; H05K 13/04
[52] U.S. Cl. ................................ 29/827; 29/832; 206/328
[58] Field of Search ............... 29/827, 832, 874, 876, 29/700; 206/328, 330, 332, 334

[56] References Cited

U.S. PATENT DOCUMENTS 4,542,259  9/1985  Butt ............................. 174/52
4,689,866  9/1987  Cartwright ..................... 29/700

Primary Examiner—Carl E. Hall
Assistant Examiner—Taylor J. Ross
Attorney, Agent, or Firm—Lester H. Birnbaum

[57] ABSTRACT

Disclosed is a method of fabricating leaded packages, including protection of the leads during various processing steps. The packages are mounted in special carriers such that the leads are shielded from loads which might otherwise cause damage to the leads.

10 Claims, 4 Drawing Sheets

FABRICATION OF LEADED PACKAGES

BACKGROUND OF THE INVENTION

This invention relates to the fabrication of packages for electronic components.

Semiconductor chips are packaged in a variety of ways for mounting to printed circuit boards. When high reliability and performance are needed, the chip is typically mounted in a ceramic package which can be hermetically sealed. The chip and package then go through a variety of processing steps such as wire bonding of the chip and package contact pads, cleaning, and lid attachment.

With the growing attraction for surface mounting of packages on the circuit board, a new type of ceramic package has been introduced. This package includes conductive leads extending from the top surface of the package and extending downwardly along the borders of the ceramic. The leads are typically formed in a J-configuration so that the curved portion can be soldered to the surface of the circuit board.

While the leaded packages provide surface mount capability, a problem exists in assembly of the chip and package. That is, the leads can be bent and damaged if they are subject to a load during the fabrication sequence. Since a pattern of solder pads corresponding to the package leads is formed on the circuit board, proper lead orientation is important for mounting. Lead repair is costly and time consuming.

It is, therefore, an object of the invention to fabricate leaded packages in a way which avoids damage to the leads.

SUMMARY OF THE INVENTION

This and other objects are achieved in accordance with the invention which, in one aspect, is a method of fabricating a package which includes a housing and conductive leads extending upon the borders at the housing. The method includes the step of temporarily mounting the package within a carrier which comprises means for enclosing the leads, while a portion of the housing is exposed, so as to prevent damage due to forces applied to the package.

In accordance with another aspect, the invention is a carrier for temporarily mounting therein a package including a housing and conductive leads extending from a surface of the housing and beyond the borders of the housing. The carrier comprises a pedestal for receiving the housing and at least two side walls spaced from the pedestal to form gaps therebetween. The gaps have a size and shape so as to receive the leads and so that the side walls enclose a major portion of the leads. The carrier further includes means for covering a portion of the top surface of the housing.

BRIEF DESCRIPTION OF THE DRAWING

These and other features of the invention will be delineated in detail in the following description. In the drawing.

It will be appreciated that, for purposes of illustration, these figures are not necessarily drawn to scale.

DETAILED DESCRIPTION

Figure 1:
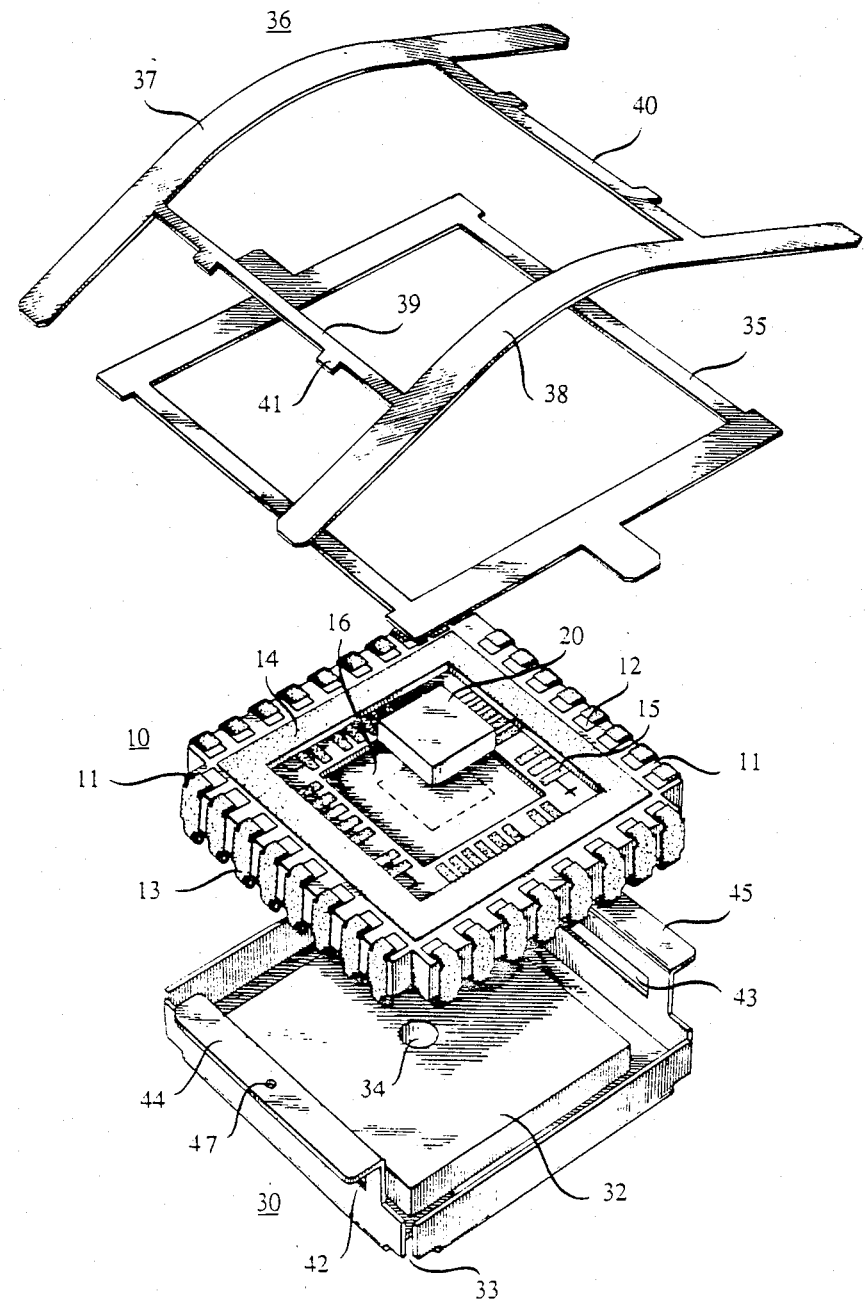
FIG. 1 is an exploded perspective view of the combination of package and carrier in accordance with one embodiment of the invention.

A typical sequence for fabricating leaded packages in accordance with one embodiment of the invention starts with a leaded package such as illustrated as 10 in FIG. 1. The package includes a housing, 11, typically made of ceramic, having a top surface which includes a first set of conductive pads such as 12 formed thereon at the perimeter of the housing. Bonded to the pads, typically by brazing, are conductive leads such as 13 which extend beyond the border of the housing 11. In the example, the leads are bent downward into a J-configuration extending below the bottom surface of the housing (see FIG. 2). The package may also include a gold plated portion, 14, at the top surface to provide a bonding site for the package lid (not shown). A ledge portion below the top surface includes a second set of conductive pads such as 15 which are electrically coupled to corresponding pads of the first set through the housing 11 of the package. A portion of the package which is further recessed from the ledge portion may include a gold bonding pad, 16, upon which the semiconductor chip 20 is mounted.

The J-shaped leads, 13, are typically made of an iron-nickel alloy and are quite susceptible to bending whenever pressure is applied anywhere along the lead surface. Consequently, in order to provide protection of the leads during subsequent processing, the package is mounted within a carrier 30. The carrier includes four side walls, such as 31, defining a square or rectangular enclosure. The floor of the enclosure includes, as an integral part thereof, a pedestal 32, which is suitable for receiving thereon the package element 10. A gap is formed between the pedestal and side walls so that the J-leads are positioned in the gap when the housing, 11, of the package is placed on the pedestal (see FIG. 2). It will be noted that the leads do not make contact with pedestal and that the major portion of the leads (primarily the sides and bottom portions) are enclosed by the side walls. It will also be noted that the package element is not bonded in a permanent fashion to the pedestal to permit removal of the package at some point in the processing (e.g., for electrical testing).

The floor of the enclosure also includes holes, such as 33 formed therein at each corner to permit drainage of any fluid introduced into the carrier during the fabrication. A hole, 34 also extends through the pedestal for the purpose of introducing a vacuum source when it is desired to hold the package in a fixture.

The carrier further includes a cover plate 35 with a hollow interior such that when the cover is placed over the package element, 10, it will cover the top portion of the leads, 13, while leaving exposed the remainder of the package. The cover plate and the package are held in place by a spring element, 36, which includes flexible clips 37 and 38 connected by tie bars 39 and 40. The tie bars include protruding members, such as 41. These members fit within slots 42 and 43 formed in extensions 44 and 45 of two of the side walls of the bottom portion of the carrier. These extensions permit the carrier to be handled with tweezers or other handling means. A hole, 47, is used to provide proper orientation of the package when inserted in fixtures during assembly.

The body portion of the carrier is typically made of aluminum or ceramic, and the cover plate and spring element are made of stainless steel.

Figure 2:
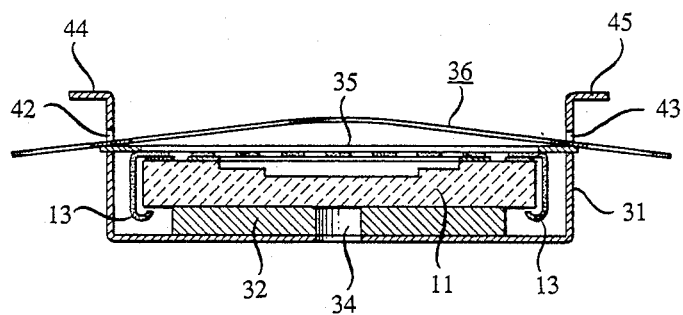
FIG. 2 is a cross-sectional view of a carrier and package in accordance with the embodiment of FIG. 1.
Figure 4:
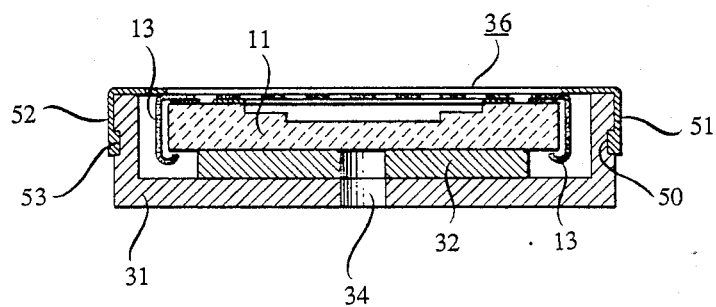
FIG. 4 is a cross-sectional view of a carrier and package in accordance with the embodiment of FIG. 3.
Figure 3:
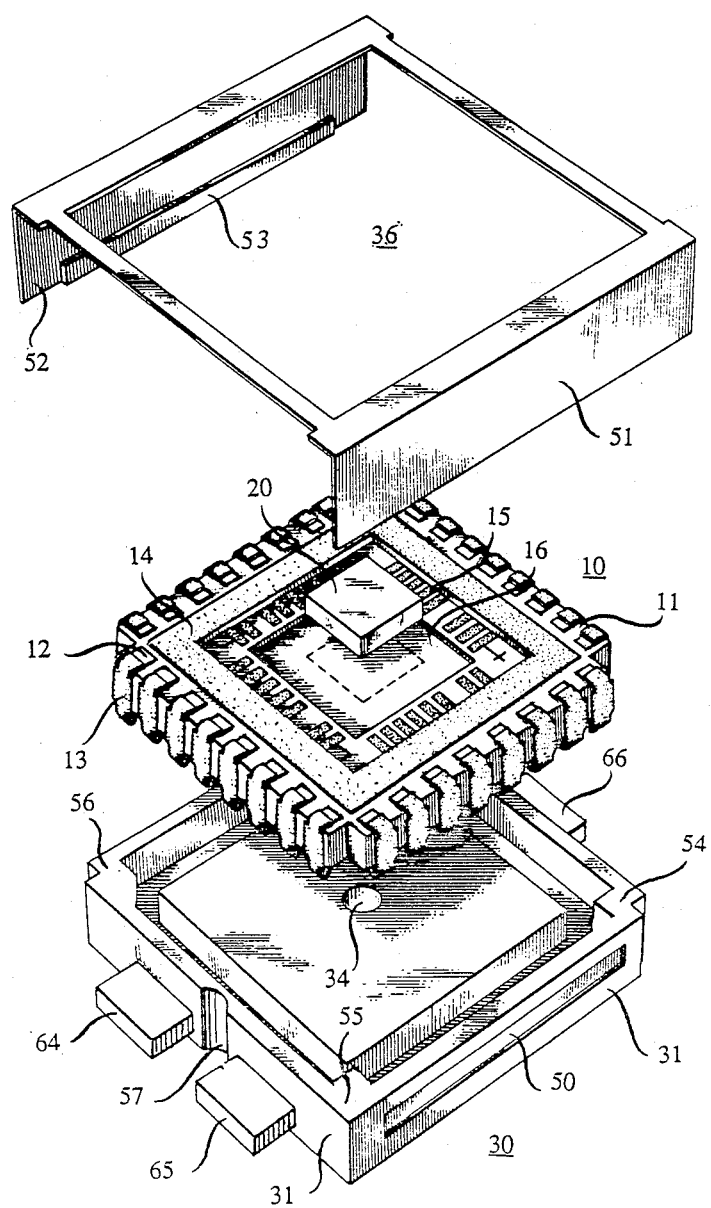
FIG. 3 is an exploded perspective view of the combination of package and carrier in accordance with a further embodiment of the invention.

An alternative form of the carrier is shown in perspective view of FIG. 3 and the cross-sectional view of FIG. 4, with elements corresponding to those of FIGS. 1 and 2 being similarly numbered. In this embodiment, two of the side walls, e.g. 31, include indented portions, e.g., 50. The cover element, 36, includes side panels, 51 and 52 which extend over the side walls when the cover is placed over the packaging element. The side panels include protruding portions, e.g., 53 which engage the indented portions in the side walls to hold the cover in place. The cover plate would typically be made of stainless steel. It will also be noted that the body portion of this embodiment includes corner tabs, 54, 55 and 56 which are designed to orient the package with respect to the carrier. A notch, 57, in one of the side wall provides an orientation for the package in any fixture during the assembly process. Tabs 64, 65 and 66 extend from two of the side walls of the carrier to permit handling by tweezers or other means.

In either design, it will be appreciated that the carrier side walls and cover essentially completely enclose the leads while the package element is mounted on the pedestal. The leads are, therefore, isolated from forces which could cause bending or other damage to the leads in subsequent handling and processing.

Figure 5:
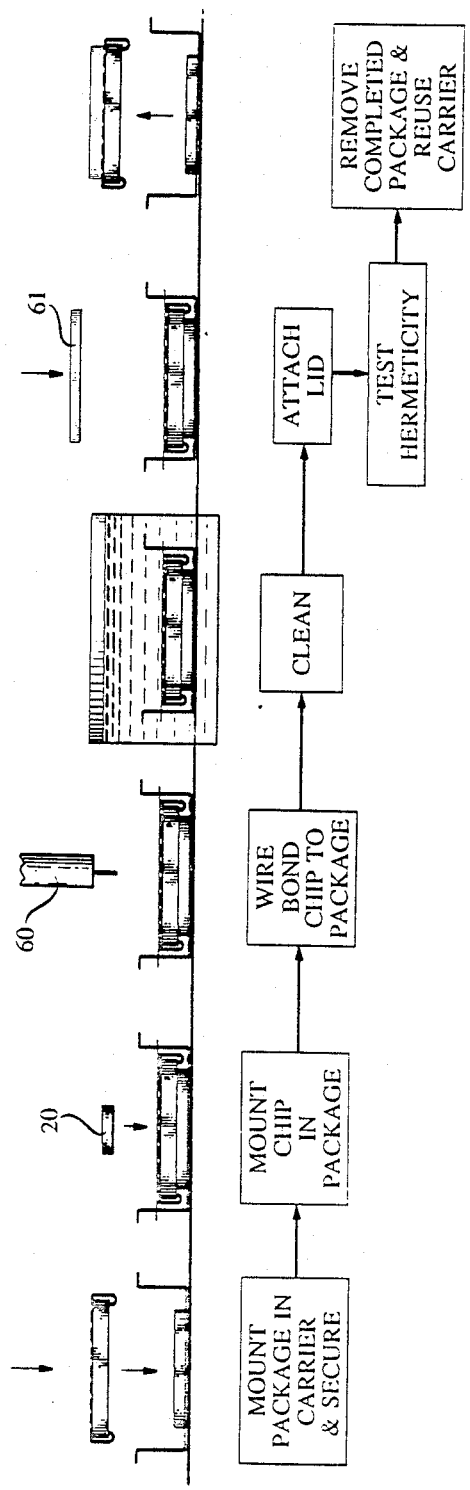
FIG. 5 is a schematic illustration of a typical sequence of steps in the fabrication of a package in accordance with an embodiment of the invention.

Some steps in a typical processing sequence utilizing the package element within the carrier are shown schematically in FIG. 5. The first step involves mounting the package within the carrier and securing it as previously discussed. Then, the chip 20 can be mounted on the package mounting pad (16 of FIG. 1) in accordance with standard techniques as shown in the second step. The third step illustrates wire bonding between the chip pads (not shown) and the package pads (e.g., 15 of FIG. 1) utilizing a standard wire header, 60, and other standard apparatus. The forces applied to the package by the header during wire bonding and mounting of the chip should have no significant effect on the protected leads.

At a subsequent stage in the fabrication, the package is subject to a cleaning operation, as illustrated in the fourth step of FIG. 5. Typically, the package is immersed in a cleaning solution in order to remove dirt and dust. Since the carrier floor includes holes (e.g., 33 of FIG. 1), the solution will drain out after the package is removed from the solution.

At a later stage, the package lid, 61, is bonded to the top portion (14 of FIG. 1) of the package to provide the hermetic seal. Hermeticity is tested after the package is thermally cycled, typically from −65° C. to 150° C. The test involves pumping helium into the package and then placing the package in standard apparetus which tests for any helium leakage. There would be a high probability of lead damage during the handling involved in this testing if a carrier were not utilized. The completed package can then be removed from the carrier for electrical tests and ultimate attachment to the next level of interconnection. The carrier can be re-used any number of times.

It will be appreciated that FIG. 5 is not intended to show all steps in the fabrication of the package. For example, at any point in the processing, the package can be removed from the carrier for purposes of electrical testing and then re-inserted into the same or a different carrier. Nor are the order of steps presented in FIG. 5 intended to be limiting.

It will be understood that while the invention has been described with reference to the fabrication of J-leaded packages, it should be useful for any package with leads with extend beyond the borders of the package housing. It may also be possible, for certain package configurations, to place more than one package in a carrier.

Various additional modifications will become apparent to those skilled in the art. All such variations which basically rely on the teachings through which the invention has advanced the art are properly considered within the scope of the invention.

What is claimed is:

1. A method of fabricating a package which includes a housing and conductive leads extending beyond the borders of the housing, the method comprising the step of temporarily mounting the package with said leads within a carrier, said carrier comprising means for enclosing said leads, while a portion of said housing is exposed, so as to prevent damage to said leads due to forces applied to said package.

2. The method according to claim 1 wherein the leads are bonded to a top portion of the housing and extend beyond the housing in a J-configuration.

3. The method according to claim 1 wherein the carrier comprises:
   a pedestal for receiving the housing;
   at least two side walls spaced from the pedestal to form gaps therebetween, the gaps having a size and shape so as to receive the leads and so that the side walls enclose a major portion of said leads; and
   means for covering the top portion of said leads.

4. The method according to claim 1 further comprising the step of mounting an electronic component in said exposed portion of the housing.

5. The method according to claim 4 wherein the component and housing include arrays of conductive pads, and further comprising the step of wire bonding corresponding pads of the two arrays.

6. The method according to claim 4 further comprising cleaning said component and housing by immersion in a solution.

7. The method according to claim 6 wherein the carrier includes openings therein which permit drainage of the solution out of the carrier.

8. The method according to claim 4 further comprising the step of attaching a lid to the exposed portion of the housing so as to seal the component within the housing.

9. The method according to claim 3 further comprising the step of thermal cycling the package and then testing for hermeticity.

10. The method according to claim 4 further comprising the step of subsequently removing the package from the carrier.

* * * * *